US010169832B2

(12) United States Patent
Soysal et al.

(10) Patent No.: US 10,169,832 B2
(45) Date of Patent: Jan. 1, 2019

(54) METHOD AND INSTRUMENTATION FOR SUSTAINABLE ENERGY LOAD FLOW MANAGEMENT SYSTEM PERFORMING AS RESILIENT ADAPTIVE MICROGRID SYSTEM

(71) Applicants: Oguz Soysal, Frostburg, MD (US); Hilkat Soysal, Frostburg, MD (US); Charles Leo Manto, Arnold, MD (US)

(72) Inventors: Oguz Soysal, Frostburg, MD (US); Hilkat Soysal, Frostburg, MD (US); Charles Leo Manto, Arnold, MD (US)

(73) Assignee: Instant Access Networks, LLC

( * ) Notice: Subject to any disclaimer, the term of this patent is extended or adjusted under 35 U.S.C. 154(b) by 598 days.

(21) Appl. No.: 13/889,867

(22) Filed: May 8, 2013

(65) Prior Publication Data

US 2014/0337002 A1 Nov. 13, 2014

(51) Int. Cl.
*G06G 7/54* (2006.01)
*G06Q 50/06* (2012.01)
(Continued)

(52) U.S. Cl.
CPC ......... *G06Q 50/06* (2013.01); *G06F 17/5009* (2013.01); *H02J 3/14* (2013.01);
(Continued)

(58) Field of Classification Search
CPC ...................................... G06Q 50/06
(Continued)

(56) References Cited

U.S. PATENT DOCUMENTS 7,274,975 B2 * 9/2007 Miller .................... G06Q 50/06
700/295
7,333,880 B2 * 2/2008 Brewster ................ G06Q 10/00
700/22

(Continued)

OTHER PUBLICATIONS

Hajizadeh et al("Intelligent power management strategy of hybrid distributed generation system", Electrical Power and Energy Systems 29 (2007) 783-795).*

(Continued)

*Primary Examiner* — Omar Fernandez Rivas
*Assistant Examiner* — Iftekhar Khan
(74) *Attorney, Agent, or Firm* — Kurtz Firm, PLLC; Richard E. Kurtz (57) ABSTRACT

Disclosed is a method and instrumentation for predictive and adaptive controllers devised to ensure uninterrupted operation of standalone electrical supply systems powered by sustainable energy sources. The device hereby referred to as SelfMaster™ is an expert system that manages the energy conversion, storage, and consumption in an isolated electric grid based on data collected during past and current operation of the system and predicted future states of the primary energy sources, storage level, and demand. The sustainable primary energy sources managed by SelfMaster™ may include, but not limited to, wind force, solar radiation, and biofuels. The energy storage system is a combination of batteries, hydrogen, biofuel, and hot water tanks. Electric demand consists of critical, non-critical, and deferrable loads identified according to the activities supported by the supply system.

12 Claims, 7 Drawing Sheets

Outline of a sustainable standalone electrical supply system controlled by SelfMaster™

(51) Int. Cl.
| | |
|---|---|
| G06F 17/50 | (2006.01) |
| H02J 3/14 | (2006.01) |
| H02J 3/28 | (2006.01) |
| H02J 3/30 | (2006.01) |
| H02J 3/32 | (2006.01) |
| H02J 3/38 | (2006.01) |
| H02J 13/00 | (2006.01) |
| H02J 3/00 | (2006.01) |

(52) U.S. Cl.
CPC . *H02J 3/28* (2013.01); *H02J 3/30* (2013.01); *H02J 3/32* (2013.01); *H02J 3/383* (2013.01); *H02J 3/386* (2013.01); *H02J 13/0006* (2013.01); *H02J 2003/007* (2013.01); *H02J 2003/143* (2013.01); *Y02B 70/3266* (2013.01); *Y02B 90/222* (2013.01); *Y02E 10/563* (2013.01); *Y02E 10/566* (2013.01); *Y02E 10/763* (2013.01); *Y02E 40/72* (2013.01); *Y04S 10/123* (2013.01); *Y04S 20/12* (2013.01); *Y04S 20/242* (2013.01)

(58) Field of Classification Search
USPC .......................................................... 703/18
See application file for complete search history.

(56) References Cited

U.S. PATENT DOCUMENTS

| | | | | | |
|---|---|---|---|---|---|
| 8,024,073 | B2* | 9/2011 | Imes | ...................... | F24F 11/006 700/276 |
| 8,174,381 | B2* | 5/2012 | Imes | ...................... | F24F 11/006 340/539.23 |
| 8,222,765 | B2* | 7/2012 | Collins | .................. | F01B 21/04 307/44 |
| 8,280,799 | B2* | 10/2012 | Bing | ........................ | G01W 1/10 705/35 |
| 8,334,606 | B2* | 12/2012 | Oohara | ................... | F03D 7/028 290/44 |
| 8,704,390 | B2* | 4/2014 | Haj-Maharsi | ......... | F03D 7/0224 290/43 |
| 8,706,650 | B2* | 4/2014 | Ozog | ..................... | G06Q 10/06 705/412 |
| 9,188,109 | B2 | 11/2015 | Lazaris | ............. | G06Q 30/0605 |
| 2006/0192435 | A1* | 8/2006 | Parmley | .................... | H02J 1/10 307/66 |
| 2008/0179887 | A1* | 7/2008 | Kawazoe | ................ | F03D 7/028 290/44 |
| 2009/0076661 | A1* | 3/2009 | Pearson | ............ | H01M 8/04619 700/291 |
| 2009/0295162 | A1* | 12/2009 | Oohara | ................... | F03D 7/028 290/44 |
| 2009/0319090 | A1* | 12/2009 | Dillon | ..................... | G06Q 10/04 700/291 |
| 2009/0326724 | A1* | 12/2009 | Lasseter | .................. | H02J 9/062 700/287 |
| 2009/0326726 | A1* | 12/2009 | Ippolito | .................... | H02J 3/14 700/291 |
| 2010/0198421 | A1* | 8/2010 | Fahimi | ...................... | H02J 3/32 700/291 |
| 2010/0308765 | A1* | 12/2010 | Moore | ................... | H02J 7/0013 320/103 |
| 2011/0093127 | A1* | 4/2011 | Kaplan | .................. | G06Q 10/04 700/292 |
| 2011/0227343 | A1* | 9/2011 | Yasugi | .................. | F03D 7/0296 290/44 |
| 2011/0276194 | A1* | 11/2011 | Emalfarb | ............ | B60L 11/1838 700/297 |
| 2012/0083930 | A1* | 4/2012 | Ilic | ......................... | G06Q 30/06 700/287 |
| 2012/0143385 | A1* | 6/2012 | Goldsmith | ................ | H02J 3/38 700/297 |
| 2012/0150679 | A1* | 6/2012 | Lazaris | .............. | G06Q 30/0605 705/26.2 |
| 2012/0173035 | A1* | 7/2012 | Abe | .......................... | H02J 3/00 700/297 |
| 2012/0283888 | A1* | 11/2012 | Mao | .......................... | H02J 3/14 700/291 |
| 2012/0283890 | A1* | 11/2012 | Fu | ............................. | H02J 3/14 700/295 |
| 2013/0015703 | A1* | 1/2013 | Rouse | ....................... | H02J 3/38 307/18 |
| 2013/0076140 | A1* | 3/2013 | Darden | .................... | H02J 3/381 307/64 |
| 2013/0079943 | A1* | 3/2013 | Darden, II | ............. | G06Q 50/06 700/297 |
| 2013/0099565 | A1* | 4/2013 | Sachs | ........................ | H02J 3/46 307/25 |
| 2013/0169064 | A1* | 7/2013 | Park | ......................... | H02J 3/28 307/112 |
| 2013/0342020 | A1* | 12/2013 | Blevins | ..................... | H02J 4/00 307/84 |
| 2014/0129040 | A1* | 5/2014 | Emadi | .................... | G06Q 50/06 700/291 |
| 2014/0249680 | A1* | 9/2014 | Wenzel | ..................... | G05F 1/66 700/276 |
| 2014/0350743 | A1* | 11/2014 | Asghari | ..................... | G05B 13/048 700/297 |

OTHER PUBLICATIONS

R. Palma-Behnke, C. Benavides, E. Aranda, J. Llanos, and D. Saez, Palma-Behnke et al("Energy management system for a renewable based nicrogrid with a demand side management mechanism," in Proc. 2011 IEEE Symp. Comput. Intell. Appl. Smart Grid (SSCI 2011 CIASG), Paris, France, Apr. 11-15, 2011).*

Morais et al. ("Optimal scheduling of a renewable micro-grid in an isolated load area using mixed-integer linear programming", Renewable Energy 35 (2010) 151-156).*

* cited by examiner

Figure 1 Outline of a sustainable standalone electrical supply system controlled by SelfMaster™

Figure 2 Interaction of SelfMaster™ with a micro-grid

Figure 3 Flowchart for the energy management and control process

Figure 4 Flowchart of Observation Routine Operation

Figure 5 Outline of the local data logging system

Figure 6: Flowchart of the resource estimation process

Figure 7 Flowchart of the simulation, scheduling, and control processes

METHOD AND INSTRUMENTATION FOR SUSTAINABLE ENERGY LOAD FLOW MANAGEMENT SYSTEM PERFORMING AS RESILIENT ADAPTIVE MICROGRID SYSTEM This application claims the benefit of U.S. Provisional Application No 61/643,987, filed May 8, 2012, the entire disclosure of which is hereby incorporated by reference,

CROSS-REFERENCE TO RELATED APPLICATIONS

| U.S. Patent Documents | | |
|---|---|---|
| 7,274,975 | Sep. 25, 2007 | Miller |
| 8,024,073 | Sep. 20, 2011 | Imes, et al. |
| 8,174,381 | May 8, 2012 | Imes, et al. |
| 8,222,765 | Jul. 17, 2012 | Collins, et al. |
| 8,280,799 | Oct. 2, 2012 | Bing |
| 8,334,606 | Dec. 18, 2012 | Oohara, et al. |

OTHER REFERENCES

Heinemann, D., Lorenz, E., Girodo, M. (2006): "Solar irradiance forecasting for the management of solar energy systems", Solar 2006, Denver, Colo. (USA), 7 Aug. 2006-13 Aug. 2006

Kim, S. H, Augenbroe, G. (2012): "Using the National Digital Forecast Database for model-based building controls", Automation in Construction, 27, 170-182, 2012

NDFD, the National Forecast Database, (2010): National Weather Service, NOAA, Washington, D.C. http://www.weather.gov/ndfd/

Perez, R. et al. (2007): "Forecasting solar radiation—Preliminary evaluation of an approach based upon the national forecast database", Solar Energy 81, 809-812, 2007

Perez, R. et al., (2010): "Validation Of Short And Medium Term Operational Solar Radiation Forecasts In The US", Solar Energy, Vol. 84 Issue: 12, pp 2161-2172, 2010

MODBUS Organization, (2012): "MODBUS over serial line specification and implementation guide V1.0," available at http://www.modbus.org/

Reno, M. et al. (2012): "Global Horizontal Irradiance Clear Sky Models: Implementation and Analysis," Sandia Report SAND2012-2389

P. Ineichen and R. Perez, (2002) "A new airmass independent formulation for the Linke turbidity coefficient," Solar Energy, vol. 73, pp. 151-157.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

This application includes material, which is subject to copyright protection. The copyright owner has no objection to the facsimile reproduction by anyone of the patent disclosure, as it appears in the Patent and Trademark Office files or records, but otherwise reserves all copyright rights whatsoever.

Intelligent control of energy generation, storage, and usage is indispensable for use in a standalone supply system powered by local and renewable energy resources intended to provide uninterrupted power for mission-critical infrastructures. The probabilistic nature of wind and solar energy sources requires weather forecast information to manage and prioritize the available storage level, critical loads, non-critical loads that need to be fed on a certain time schedule, and deferrable loads. This is especially important since these local power generation systems will need to be able to provide power during seasonal and daily adjustments of anticipated renewable resource availability. For example, not only may there be seasonal adjustments to the amount of sunlight available to a specific location, there may also be daily fluctuations in the clarity of the atmosphere due to fog, smog and other variables that can impact the availability of solar energy on a particular day.

Figure 1:
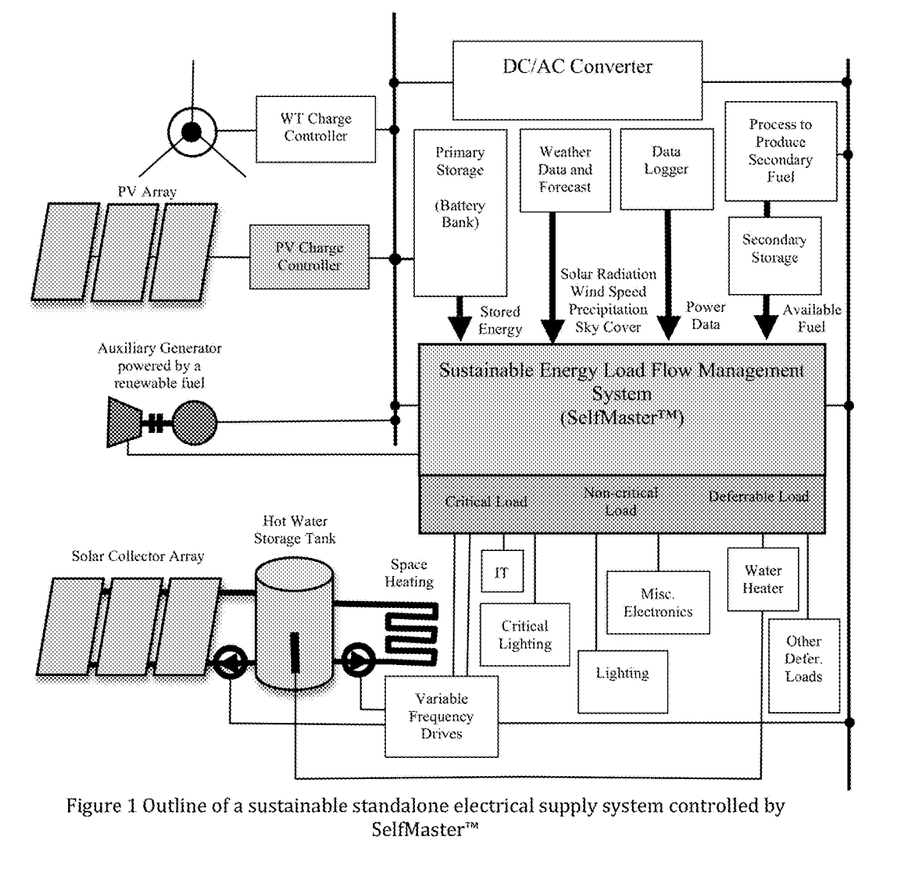
FIG. 1: Outline of a sustainable standalone micro grid supplied by renewable energy sources and controlled by SelfMaster™

The Sustainable Energy Load Flow Management System (SelfMaster™) is outlined in FIG. 1. SelfMaster™ is a microcomputer-based controller. User input defines a schedule of activities and priority of energy usage. SelfMaster™ receives forecast data from a weather service and input data from sensors monitoring generated power, storage levels, and electric demand in real time. The computer software continuously updates a database of actual component input-output characteristics. The near-future performance of the system is simulated using estimated states of the generated and stored energy, scheduled activities, and forecast data within a reasonable time interval. The storage level is assessed and optimal load distribution is determined for critical, deferrable, and non-critical loads. Computer interface circuits turn the loads on or off and provide output for variable frequency drives (VFD) that control heating, ventilation, and air conditioning (HVAC) devices.

(1) Field of the Invention

The present invention relates in general to the field of renewable energy, particularly adaptive control of electric load, energy storage, and activities in a stand-alone sustainable power system based on data collection, data communications, computer software, and electronic interface circuits.

(2) Description of Related Art Including Information Disclosed Under 37 CFR 1.97 and 198

Not applicable

BRIEF SUMMARY OF THE INVENTION

It is an object of the invention to provide a controller to manage the load and energy storage in a standalone electric supply system powered by renewable energy sources or a local micro-grid.

It is a further object of the invention to provide a continuously updated database to make actual component characteristics available for accurate estimation of future energy balance.

It is a further object of the invention to provide mass-producible product that can meet the needs of a majority of users of renewable energy systems.

It is a further object of the invention to provide an improved apparatus and software that meets needs for uninterruptible sustainable power supply for mission critical loads.

It is a further object of the invention to define the "Internal Critical Load" that is required over and above the external critical loads, to ensure the continuous reliable operation of the energy management system.

The invention in certain embodiments uses simulation techniques to forecast the energy generation and storage levels.

DETAILED DESCRIPTION OF THE INVENTION

The purpose of SelfMaster™ is to control load flow and storage in an isolated micro-grid isolated or potentially isolated from a larger grid as depicted in FIG. 1. The micro-grid is supplied by a group of wind turbines, solar PV arrays, and an optional auxiliary backup generator. The backup generator may be a combination of generators driven by a multi-fuel combustion engine, compressed air, flywheel, or fuel cell stack. Solar thermal collectors provide heating source. A hybrid storage system is a combination of primary and secondary storages. Primary storage is always a battery bank for short-term energy backup. Secondary storage may be hydrogen, biofuel, or compressed air tank, flywheel, or hot water tanks. The electric load is grouped as "Critical Load," "Non-critical Load," and "Deferrable Load." Critical load consists of internal supply for sensors, computing devices, and controllers; communication, control, signalization (IT), and emergency lighting. Non-critical load is the equipment, appliances, and devices that are needed for a comfortable life or regular functions. Audio-visual devices, daytime artificial lighting, and part of the variable frequency drives (VFD) for HVAC circulation are examples to non-critical load. Deferrable loads can be supplied at a convenient time frame based on the energy state of the micro-grid. Due to the thermal capacity and longer time constant of the HVAC systems, part of the VFD load can be considered as deferrable load. Refrigeration, pumping for water storage, and device rechargers are also deferrable loads.

Figure 2:
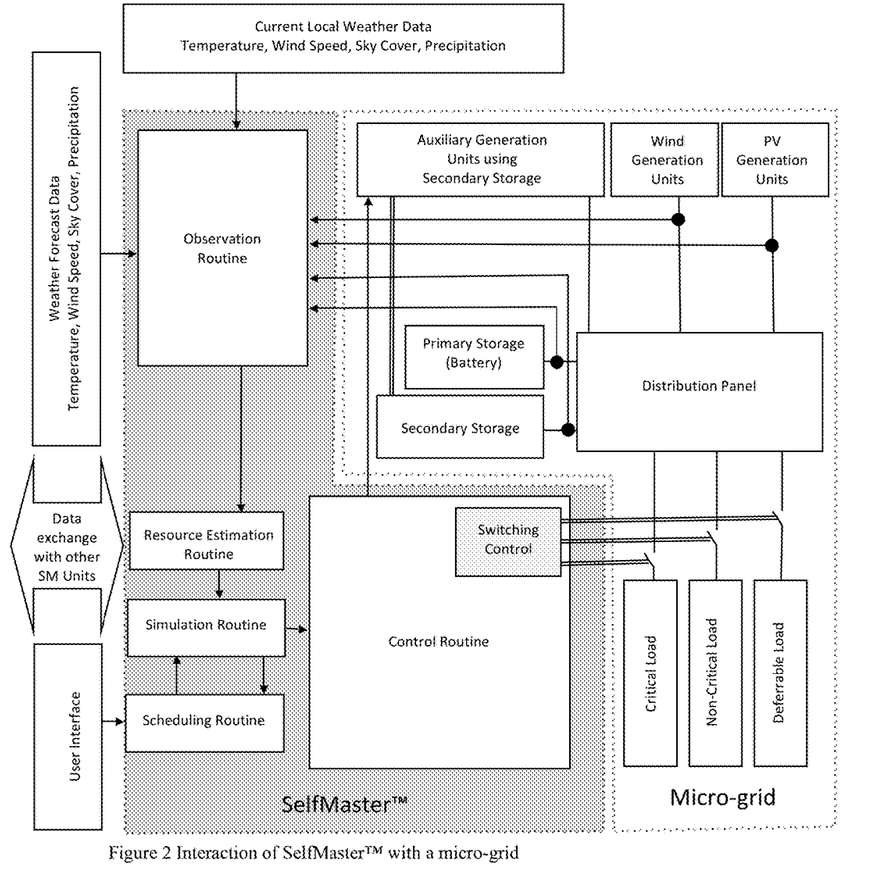
FIG. 2: Interaction of SelfMaster™ with a micro grid, power supply units, weather service provider, user, and other SelfMaster™ units.

SelfMaster is the central control unit that manages the load and storage based on current and estimated future states. Interaction of SelfMaster™ with an isolated micro-grid is shown in FIG. 2. In this figure, arrows show data flow and lines represent power connections. Data collection points are shown with a dot on the power lines. It is assumed that data collection sensors do not affect the voltage and current values on the power lines. [0013] The major components of SelfMaster™ are Observer, Resource Estimator, Simulator, Scheduler, and Controller routines. Each of these components is considered as a separate virtual device created in the computer software as separate functions. Data flow between these functions is shown in FIG. 2. An operator may interact with SelfMaster™ via a user interface to enter input data and monitor the system performance. User inputs consist of a list of activities to be scheduled, needed resources (such as space allocation, temperature, lighting, and equipment), and priority level of each activity. Data is logged both at the micro-grid and/or at a remote location. In addition, several SelfMaster units may communicate with each other to control a cluster of micro grids.

Outline of the Operation

Figure 3:
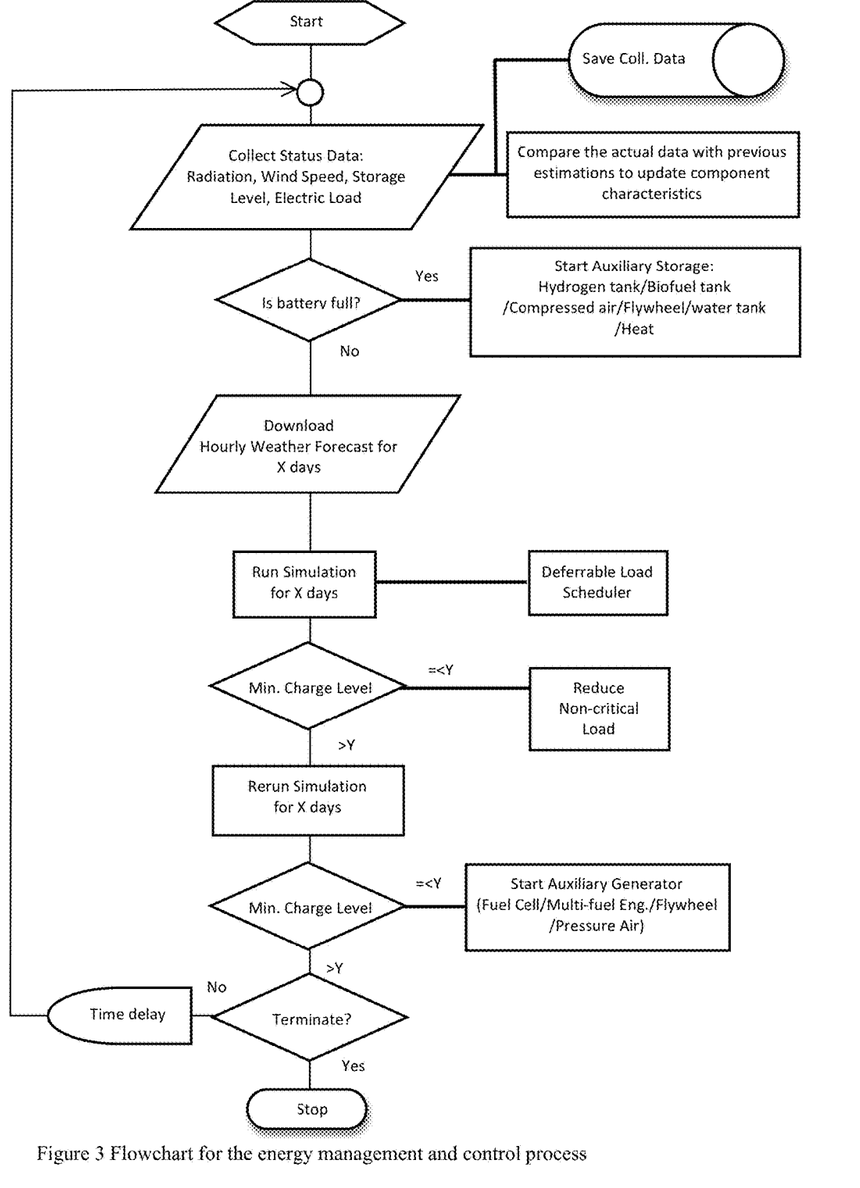
FIG. 3: Flowchart of energy management process performed by SelfMaster™

The flowchart in FIG. 3 shows the overall operation of SelfMaster™. Collected data is processed to determine the status of the micro-grid. If the battery bank is full, then the excess energy will be stored in non-electrical form such as (but not limited to) hydrogen, methane, other gaseous or liquid fuels, biofuel production, thermal (hot water), kinetic (flywheel), or potential energy (compressed air, pumped water).

Weather forecast data for the following given number of days is automatically downloaded from a weather station (such as National Weather Service—NWS) database every hour. The hourly generation, storage, and consumption values are estimated for a given time interval through real-time simulation based on the forecast information and user defined load profiles. The anticipated storage level is checked at every simulation and deferred load is scheduled to optimize the energy balance. If the storage level is expected to fall below a user defined critical level, then SelfMaster will start available auxiliary generation to charge the battery bank until the first upcoming simulation indicates an adequate level of electric storage.

The forecast data relevant to the operation of SelfMaster™ are temperature (θ), surface wind speed (V), and percent sky cover (C). The computer program sends a SOAP request to the NDFD XML server through the Internet. The SOAP response received from the server is converted to a data table and stored in a file.

Data acquisition hardware and software collect the DC voltage and current outputs and cell temperatures of the series connected PV modules. If the PV array is generating power, the DC output of the charge controllers and AC output values of the inverters are recorded simultaneously to compute the actual efficiencies and update the PV database.

Similarly, a separate data acquisition system collects the output voltage, current, and frequency of the wind generators. If any of the wind turbines is generating power, then the DC output of the charge controllers and AC output values of the inverters are recorded simultaneously to compute the actual efficiencies and update the wind turbine (WT) database.

Energy stored in the primary storage (battery bank) is determined by recording the actual charge and discharge amp-hours.

The energy reserve available in the secondary storage is evaluated based on non-electrical quantities, such as temperature, pressure, volume of fuel, etc., depending on the type of energy stored. The amount of stored fuel is converted to electrical energy equivalent using the specific value of the stored substance such as hydrogen, methane, biomass, biodiesel, or anaerobic digestion products.

Observation Routine

The "Observation Routine" named hereafter "observer" receives inputs from sensors, a weather forecast service, and user interface. Sensors and data acquisition hardware collect electrical and non-electrical quantities such as voltages, currents, temperatures, liquid level, and pressures, etc. A local weather station on site provides current temperature, wind speed, sky cover, and precipitation data at the actual location. Forecast data is periodically downloaded from a weather station to record hourly temperature, wind speed, sky cover, and probability of snow precipitation for a given number of days. Collected data is stored in a local memory device and also sent to a remote storage device. In addition, the observer routine computes the actual efficiency of the generation units and updates the databases.

Manufacturers usually give typical catalog specifications of wind turbines, solar PV modules, and converters based on factory tests and guaranteed rated values. However, the actual efficiency of these components depends on environmental conditions, aging, and possible faults or damages during service. The observer updates periodically the actual state of each power supply component for more accurate estimation. It also generates warning or alarm signals when critical generation issues occur. Data collected by sensors is logged in (both at the device and possibly in a remote location as part of a power management and network management system for the micro-grid) for reporting, troubleshooting, and future reference and, when appropriate, communicated to other elements of the micro-grid.

Figure 4:
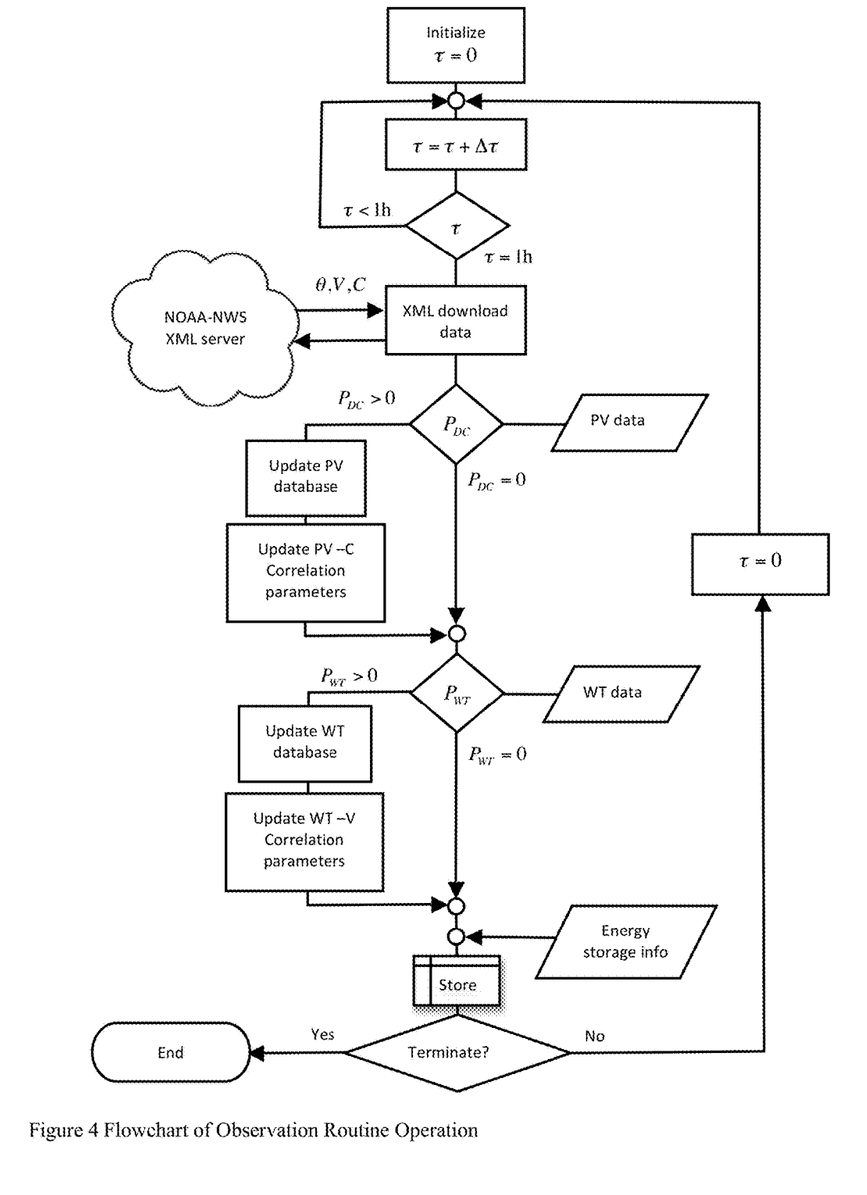
FIG. 4: Flowchart of the "Observation Routine" process

FIG. 4 shows a flowchart explaining the observation process. The computer program downloads periodically weather forecast data for the following 105 hours from National Oceanic and Atmospheric Administration's (NOAA) National Weather Service NWS) database. NOAA updates the US National Digital Forecast Database (NDFD) every hour with forecasts data produced on a 3-hourly basis for up to three days ahead and on a 6-hourly basis up to six days ahead. NDFD provides gridded data for a location specified by either the postal (zip) code or GPS coordinates. Perez et al. (2010) present a validation of the NDFD short-term forecast. Kim and Augenbroe (2012) discuss the adequacy of NDFD forecasts for building automation and control processes. According to the evaluations presented in these publications, NDFD provides an acceptable level of accuracy up to a forecast horizon of six hours.

While other forecast methods presented in Heinemann et al. (2006) and Perez et al. (2007) can provide more accurate forecasts beyond 6-hour horizon, SelfMaster™ uses the NDFD for the following reasons:

Temperature, surface wind speed, sky cover index, and chance of snow precipitation are available in the database Service continuity and quality control is ensured by the US National Oceanic and Atmospheric Agency (NOAA)

Service is updated every hour for a grid of 5-km spatial resolution for the contiguous US NDFD is an open source web service accessible to public through Simple Object Access Protocol (SOAP) in the Extensible Markup Language (XML) format.

Figure 5:
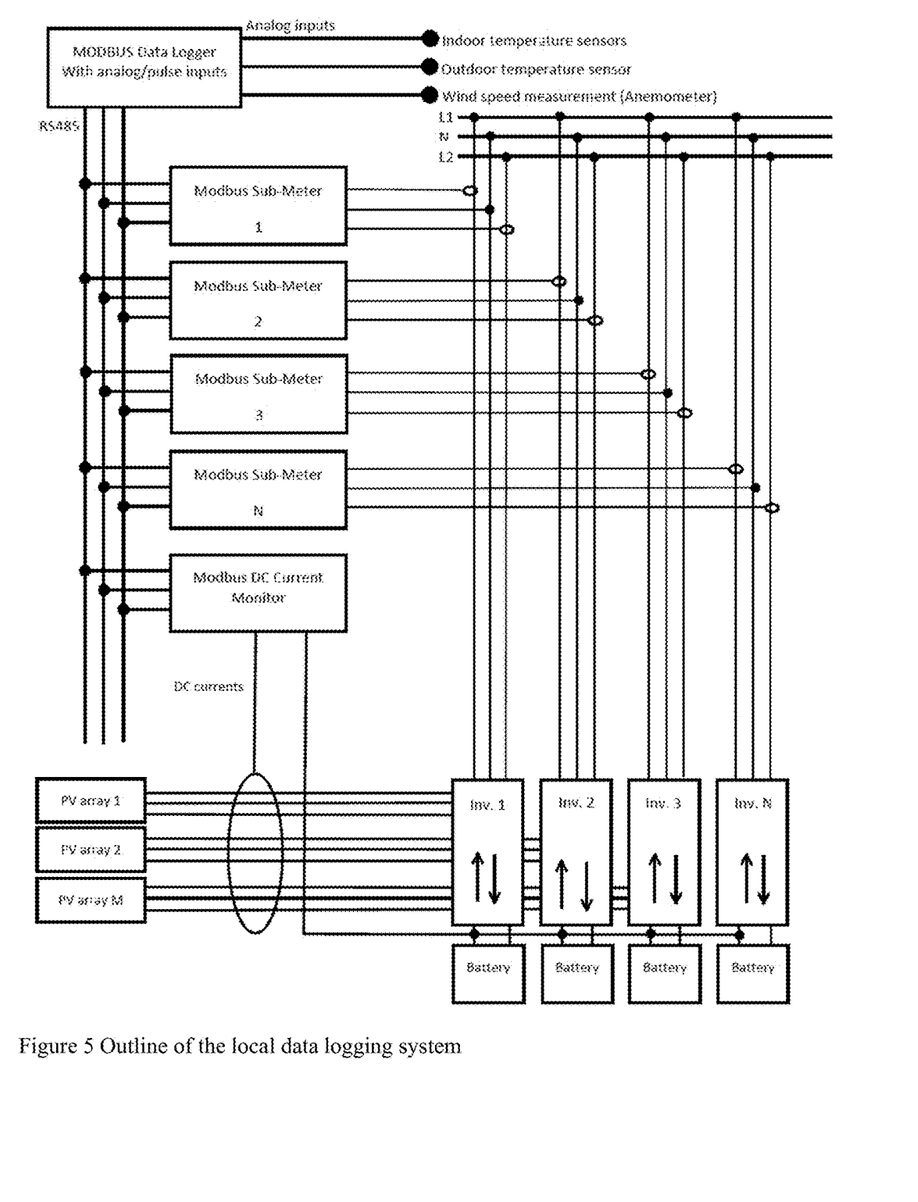
FIG. 5: Data logging system

A schematic outline of the local data logging system is shown in FIG. 5. The data logger and sub-meters are off-the-shelf monitoring devices available on the market. The devices communicate with the data logger via RS485 connection using the MODBUS protocol. The serial data communication is described in the document "MODBUS Organization, (2012)." The data logger supplies data to a local computer and provides remote access through the Internet.

Resource Estimation Routine

The "Resource Estimation Routine," named hereafter "estimator", uses the database created by the "observer". It computes the estimated power generation for the period of time covered by the weather forecast using four sources of data listed below.

Figure 6:
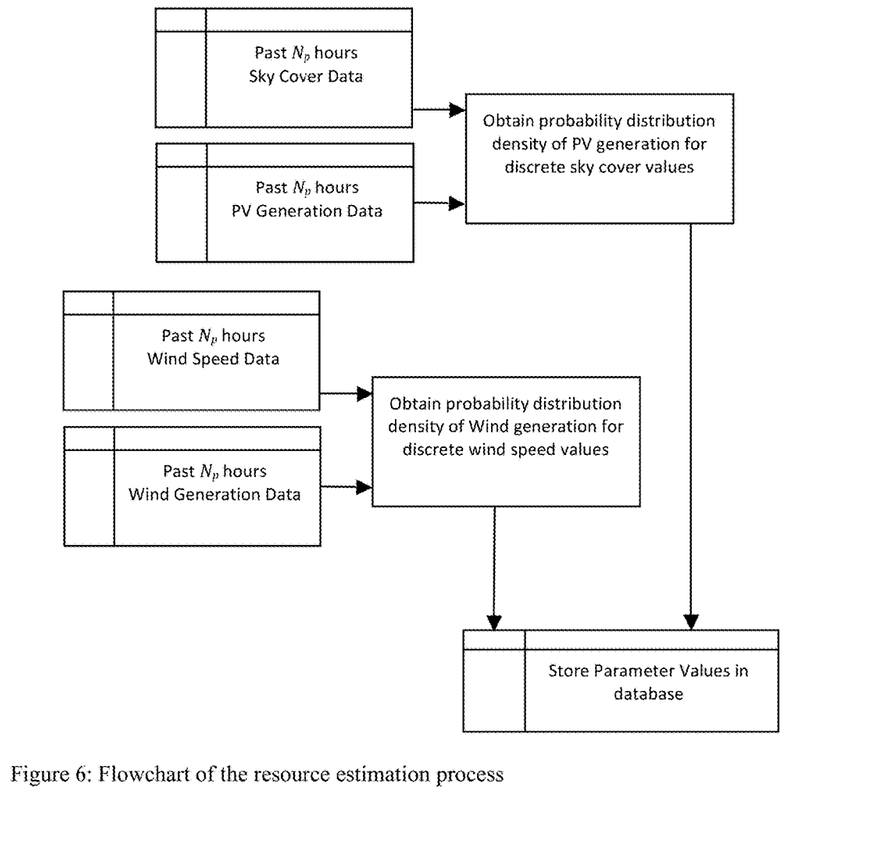
FIG. 6: Flowchart of the resource estimation process

Forecasted wind speed, sky cover, and snow precipitation data downloaded from NDFD Actual generation data collected by the local data acquisition system Extraterrestrial global solar radiation data obtained from NREL SolPos software Characteristics of solar PV modules and wind turbines provided by the manufacturers The first step of the estimation process is to correlate the actual PV generation to the sky cover and snow precipitation history recorded over the last $N_p$ number of days. A reasonable default value of 30-day is selected for $N_p$ to record the seasonal variation of the solar path, average temperature, shading, snow, and dust cover, or any loss of energy due to equipment faults. Extraterrestrial global radiation given in W/m$^2$ does not depend on the sky cover conditions. A number of methods to estimate the "clear sky irradiation" at a location on the earth surface were compared by Reno et al. (2012). Simple clear sky models only based on geometric calculations can be used in estimation of the global irradiation since the sky cover data already include atmospheric parameters considered in more complex models. Average errors of various models as a percentage of measured irradiance for 30 sites in the US are compared in FIG. 22 of Reno et al. (2012).

Ineichen and Perez model proves to be reasonably adequate with 5% Root Mean Square Error (RMSE). Expression (1) below describes the Global Horizontal Irradiation (GHI) for the Ineichen and Perez model.

$$GHI = c_{g1} \cdot I_0 \cdot \cos(z) \cdot e^{-c_{g2}M_a[fh_1 + fh_2(T_L - 1)]} \cdot e^{0.01 \cdot M_a^{1.8}} \quad (1)$$

In this expression z is the zenith angle calculated for the location and time, $I_0$ is the extraterrestrial normal incident irradiation, $A_m$ represents the air mass, and $T_L$ is the atmospheric (Linke) turbidity reformulated by P. Ineichen and R. Perez, (2002)

$$c_{g1} = 5.09 \cdot e^{-5h} + 0.868$$

$$c_{g2} = 3.92 \cdot e^{-5h} + 0.0387 \quad (2)$$

In (2) h is the elevation.

The "Atmospheric Efficiency" $E_a$ is defined here as the ratio of the actual DC power generated by the PV array and the DC power this array would produce for the GHI calculated for the given location and time. The atmospheric efficiency is zero at night. The $E_a$ value obtained at a given instant during daytime is a function of many factors such as cloudiness, clearness, water vapor content, and ozone layer thickness. The estimator first obtains a linear correlation of the computed atmospheric efficiency values and the recorded sky cover values at the observation times. As well as the atmospheric conditions, shading, dusting, and minor defects of the modules are included in this correlation.

Resource Estimation Methodology

The "Resource Estimation Routine" is outlined in FIG. 6. The purpose of this routine is to estimate available energy sources, electric storage, and energy capacity of stored fuel at the current time and for the following $N_f$ number of hours.

The sky cover (cloudiness) index provided in the NDFD is not directly related to the solar irradiation received at the earth surface. In addition, microclimate, shading, dust cover, and aging affect the output power of PV modules.

Simulation and Scheduling Routines

Figure 7:
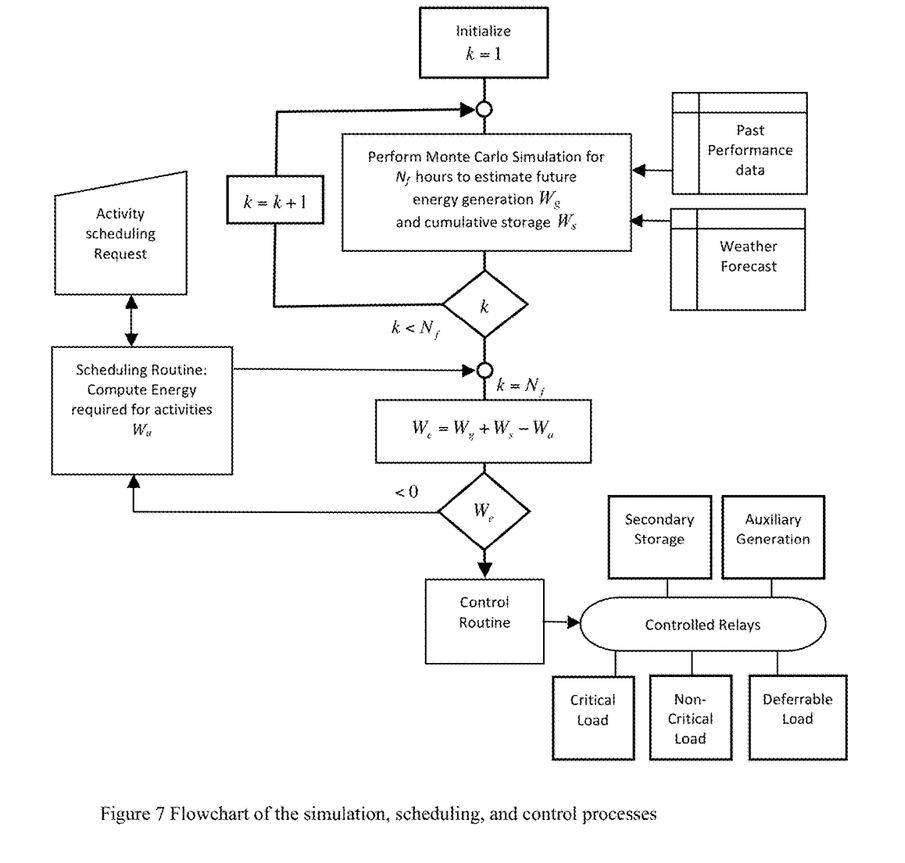
FIG. 7: Flowchart of the simulation, scheduling, and control processes

FIG. 7 shows a flowchart for the simulation and scheduling, and control routines. The "Simulation Routine", named hereafter "simulator", receives actual power generation data and performance characteristics from the database generated by the observer. A Monte-Carlo simulation is performed to estimate the generated power $P_g$ and cumulative stored energy $W_s(t)$ over the forecast horizon of $N_f$ hours.

An operator (user) enters planned activities by specifying the priority level, planned start and end times, light, heat, and equipment needed for each activity. The scheduling routine estimates the energy needed for the requested activities ($W_a$) and tries to place them at the requested time slots on the schedule. The difference between available and needed energy at all instants is computed.

$$W_e^k = W_g^k + W_s^k - W_a^k \qquad (3)$$

If the simulations do not guarantee sufficient energy at all instants for the requested activities (i.e. $W_e^k > 0$), the scheduling routine may shift deferrable loads to obtain an optimal load distribution. If the needed energy is still not available, the scheduler suggests better time frames available for the requested activities or recommends the user to reschedule or revise the request.

The simulator and scheduler routines interact to find an optimal activity schedule that can be supplied by the available resources. If the iterations converge to the optimal load distribution over the forecast horizon, then the final schedule is forwarded to the controller, which sends signals to the switching hardware to turn on or off groups of critical, non-critical, and deferrable loads as well as activate the secondary storage or auxiliary generation units if needed.

I claim:

1. A system and method of managing microgrids using Observer, Resource Estimator, Simulator, Scheduler, and Controller routines each considered as a separate virtual device created in the computer software as separate functions, comprising the steps of:
   using a processor of a computing device to check collected processed data to determine the status of the micro-grid;
   using the processor to determine if an electric battery bank is full, and if so then to command channelling excess energy to be stored in non-electrical form;
   using the processor to determine if a secondary energy storage system is full, and if so then to command diverting power into dummy loads;
   if the battery bank is not full, then using the processor to determine the likely available energy given weather data collected and weather forecasted in an observer routine, the step using a resource estimator routine to determine an amount of likely available energy required for an adequate level of electric storage, and then to:
   i) run a load scheduler which limits use of deferrable loads by sending signals from a controlling computer to turn off deferrable loads according to priorities until a simulation indicates an adequate level of electric storage;
   ii) then, if the level of electric storage is not indicated to be adequate, command on the use of the secondary energy storage system; then,
   iii) provide alarms and alerts to the system management system showing the use of the energy storage system; then,
   iv) check the rate of the energy storage system and continue to use the auxiliary energy system until the rate changes in order to meet the adequate level of electric storage;
   v) compare an amount of energy reserve in the secondary storage system and the observer routine to determine projected power coming into the system, and using the resource estimator routine to determine the amount of time the auxiliary storage system will provide the needed amount of energy and provide alerts and alarms to the system management system;
   using the processor to determine if the auxiliary energy storage system continues to discharge, and if so then, determine priorities of critical loads and begin to reduce the critical loads, maintaining the power management and alert system as the most critical load; then continue to send alarms and alerts to the management system;
   using the processor to determine if the auxiliary management system continues to discharge at an unacceptable rate, and if so then begin the final safe and orderly shut down of the system while maintaining a minimum of power and system management of the system;
   wherein each of the above steps utilizes at least one particular machine, said at least one particular machine comprising a computer and related industrial controls necessary to adjust power sources, storage systems and power using applications.

2. The method of claim 1 further comprising a step of collecting data to form a knowledge base for identification of actual component characteristics.

3. The method of claim 1 further comprising a step of the use of an expert system that learns the behavior of the components evaluating archived data.

4. The method of claim 1 further comprising steps of estimating the future states of the stochastic wind and solar resources, including temperature and precipitation, upon weather forecast data.

5. The method of claim 4, further comprising a step of using multiple sensors positioned to receive wind speed, solar radiation, sky cover, precipitation, and shading factors.

6. The method of claim 1 further comprising steps of assessing the amount of energy needed for critical loads in an energy system and considering the energy storage system itself as the most critical load to be maintained in order to protect the other critical loads.

7. The method of claim 1 further comprising a step of coordinating with a sponsored services routine whereby loads are provided to applications and users from accounts of those willing to pay for those loads.

8. The method of claim 1 further comprising a step of provisioning the microgrid with electromagnetic pulse protection.

9. The method of claim 1, wherein the non-electric form comprises at least one selected from the group consisting of: hydrogen, methane, other gaseous or liquid fuels, biofuel production, thermal, kinetic, or potential energy.

10. The method of claim 1, wherein the non-electric form comprises hot water.

11. The method of claim 1, wherein the non-electric form comprises a flywheel.

12. The method of claim 1, wherein the non-electric form comprises compressed air or pumped water.

* * * * *